United States Patent [19]

Honda et al.

[11] Patent Number: 5,399,905
[45] Date of Patent: Mar. 21, 1995

[54] RESIN SEALED SEMICONDUCTOR DEVICE INCLUDING MULTIPLE CURRENT DETECTING RESISTORS

[75] Inventors: Ziro Honda, Itami; Takashi Takahashi, Kawanishi, both of Japan

[73] Assignee: Mitsubishi Denki Kabushiki Kaisha, Tokyo, Japan

[21] Appl. No.: 182,710

[22] Filed: Jan. 13, 1994

[30] Foreign Application Priority Data

Jan. 14, 1993 [JP] Japan .................. 5-005138

[51] Int. Cl.⁶ ............... H01L 23/16; H01L 23/48; H01L 29/44; H01L 29/52
[52] U.S. Cl. .................. 257/666; 257/724; 257/676; 257/723
[58] Field of Search ............ 257/723, 724, 666, 676; 324/126, 158

[56] References Cited

U.S. PATENT DOCUMENTS

| | | | |
|---|---|---|---|
| 4,204,152 | 5/1980 | Imrie | 324/126 |
| 4,833,400 | 5/1989 | Boutigny | 324/126 |

Primary Examiner—Andrew J. James
Assistant Examiner—S. V. Clark
Attorney, Agent, or Firm—Leydig, Voit & Mayer

[57] ABSTRACT

A resin sealed semiconductor device has a plurality of current-detecting resistors mounted and electrically connected in parallel on leads of a lead frame for detecting the current flowing in a semiconductor element mounted on the lead frame. Mounting n current-detecting resistors in parallel reduces the increase in resistance due to mounting to 1/nth the conventional value. Accordingly, changes in resistance values during mounting are minimized for accurate current measurement.

5 Claims, 6 Drawing Sheets

5,399,905

RESIN SEALED SEMICONDUCTOR DEVICE INCLUDING MULTIPLE CURRENT DETECTING RESISTORS

BACKGROUND OF THE INVENTION

1. Field of the Invention

The present invention relates to a resin sealed semiconductor device, more particularly, to a multi-chip resin sealed semiconductor device incorporating an output semiconductor element and a controlling semiconductor element for controlling the output semiconductor element in a single package for use in vehicles and the like.

2. Description of the Related Arts

FIG. 7 is a schematic plan view illustrating a conventional multi-chip resin sealed semiconductor device. FIG. 8 is a side view thereof. Referring to these figures, onto a die pad of a lead frame 1 is fixed an output semiconductor element 5 by soldering and the like. On a lead 3 of the lead frame is fixed a controlling semiconductor element 7 for controlling the output semiconductor element 5 by soldering and the like. The controlling semiconductor element 7 and the leads 2 through 4 are electrically connected by means of wires 9.

Between the leads 2 and 3 is fixed by soldering and the like a chip resistance 6 which detects current flowing in the output semiconductor element 5. Excluding the tips of the leads 1 through 4, the resin sealed semiconductor device is sealed with protecting molded resin 8. The die pad of the lead frame 1 has a tapped hole 10 for securing the resin sealed semiconductor device using screws and the like.

The conventional resin sealed semiconductor device has the above-described structure. Current which is applied to this device is input from the lead 1 (power supply 13 in FIG. 10), and flows from the output semiconductor element used for switching through the wire 9 and to the lead 2. Then, it flows through a chip resistance 6 to the lead 3 (ground 14 in the same figure). At this time, voltage which is generated across the chip resistance 6, which has a low resistance value of approximately a few tens of mΩ, allows the value of the current flowing in the chip resistance 6 to be detected, so that based on this current value the current can be controlled by the controlling semiconductor element 7.

FIG. 9 illustrates an equivalent circuit in the mounting section of the chip resistance 6. FIG. 10 illustrates equivalent circuits in a current path. In these figures, the resistance value of the chip resistance 6 is represented as $R_6$. Resistance which develops by mounting the chip resistance 6 is expressed as resistance 11, and the value thereof is expressed as R. Accordingly, as a result of mounting the chip resistance 6 onto the leads 2 and 3, the total resistance value, R, of the current-detecting resistance is $R_6 + \Delta R_6$.

If the current which flows in the chip resistance 6 is taken as IE, then the consumed power, $W_6$, is $IE^2 R_6 + IE^2 \Delta R_6$.

As described above, in the resin sealed semiconductor device, mounting a low resistance chip resistance 6 makes it difficult to accurately detect the current value even when the chip resistance 6 has high precision with respect to resistance values because the resistance value is increased by soldering the mounting section and the like.

SUMMARY OF THE INVENTION

The present invention intends to solve such a problem by providing a resin sealed semiconductor device accurately detecting the current value by minimizing changes in the resistance value when the chip resistance is being mounted.

According to the present invention, there is provided a resin sealed semiconductor device having mounted on the die pad of a lead frame a semiconductor element and a controlling semiconductor element for controlling the element, and having mounted a current-detecting resistance for detecting current flowing in the semiconductor element, wherein a plurality of the above-described current-detecting resistances is mounted in parallel.

DESCRIPTION OF THE PREFERRED EMBODIMENTS

Embodiment 1

Figure 1:
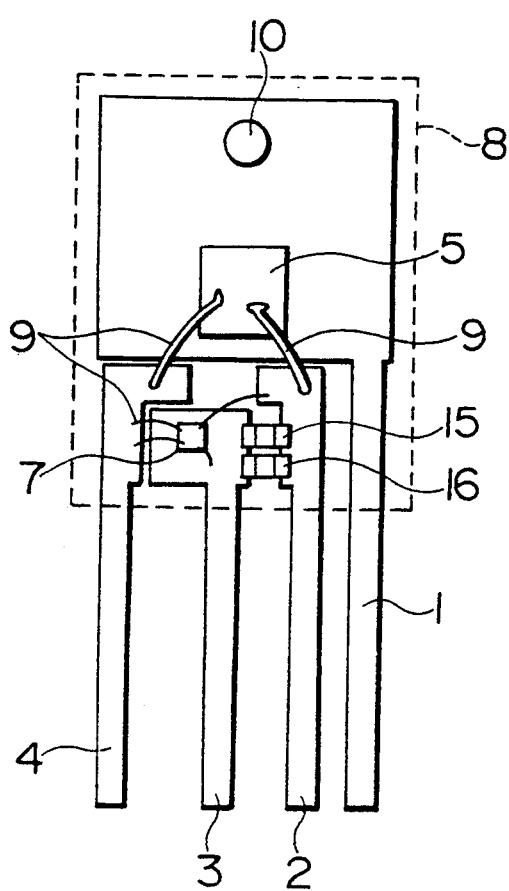
FIG. 1 is a schematic plan view illustrating a resin sealed semiconductor device in accordance with a first embodiment of the invention.

FIG. 1 is a schematic plan view showing a resin sealed semiconductor device in accordance with a first embodiment of the invention. In each of the figures, like reference numerals designate like or corresponding parts. Referring to the figure, between leads 2 and 3 are mounted chip resistances 15 and 16 in parallel by soldering and the like.

Figure 2:
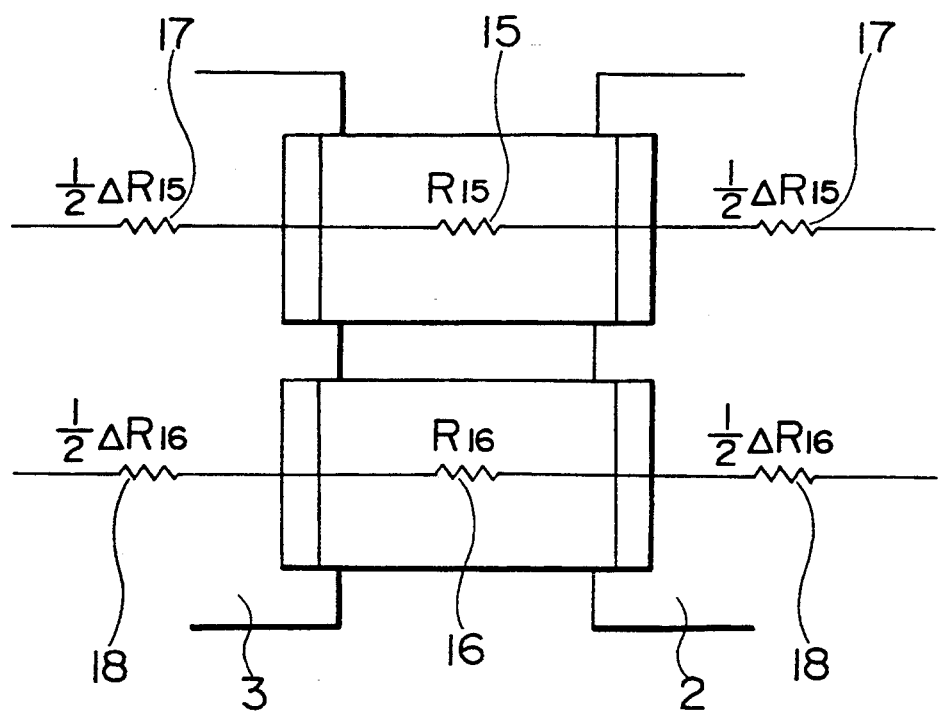
FIG. 2 is an equivalent circuit diagram in the mounting section of a chip resistance and the like in the resin sealed semiconductor device illustrated in FIG. 1.

In the resin sealed semiconductor device having the above structure, current paths are the same as those used in the conventional devices. When the current-detecting resistance is the combined resistance developed by the two chip resistances 15 and 16, mounting the chip resistances 15 and 16 produces a resistance equal to those of resistances 17 and 18 combined, as shown in FIG. 2.

Figure 3:
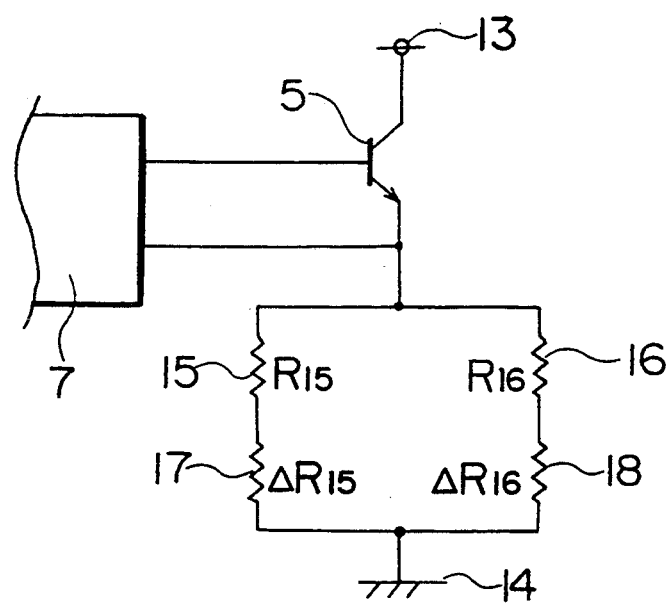
FIG. 3 is an equivalent circuit diagram of the resin sealed semiconductor device illustrated in FIG. 1.

Based on the equivalent circuits shown in FIG. 3, detecting resistance value, $R_1$, is determined, which includes the resistance values of the resistances 17 and 18 produced by mounting. Assuming the resistance value of the chip resistance 15 to be $R_{15}$, that of the chip resistance 16 to be $R_{16}$, and that equal to the resistances of the resistances 17 and 18 produced by mounting the chip resistances 15 and 16 to be $\Delta R_{15}$ and $\Delta R_{16}$, respectively, the detecting resistance $R_1$ is:

$$R_1 = \frac{(R_{15} + \Delta R_{15})(R_{16} + \Delta R_{16})}{(R_{15} + \Delta R_{15}) + (R_{16} + \Delta R_{16})}$$

Here, the relationship between the chip resistance value, $R_6$, of the conventional device, and $R_{15}$ and $R_{16}$ is:

$$2 \cdot R_6 = R_{15} = R_{16}.$$

The resistance value resulting from the mounting of the conventional chip resistance, $R_6$, is:

$$\Delta R_6 = \Delta R_{15} = \Delta R_{16}$$

Consequently, the detecting resistance, $R_1$, is:

$$R_1 = \frac{(2R_6 + \Delta R_6)^2}{2(2R_6 + \Delta R_6)} = R_6 + \frac{1}{2} \Delta R_6$$

As a result, the increase in the resistance value resulting from mounting can be reduced to $\frac{1}{2}$ the conventional value.

The current which flows in the chip resistances 15 and 16 can be also be reduced to $\frac{1}{2}$ the current value, IE, when one chip resistance is being used, so that when two chip resistances are used, the consumed power $W_{15}$ and $W_{16}$ of each of the chip resistances 15 and 16 are:

$$\begin{aligned} W_{15} &= (\tfrac{1}{2}IE)^2(R_{15} + \Delta R_{15}) = (\tfrac{1}{2}IE)^2(2R_6 + \Delta R_6) \\ &= \tfrac{1}{2} IE^2 \cdot R_6 + \tfrac{1}{4} IE^2 \cdot \Delta R_6 \\ W_{16} &= (\tfrac{1}{2}IE)^2(R_{16} + \Delta R_{16}) = (\tfrac{1}{2}IE)^2(2R_6 + \Delta R_6) \\ &= \tfrac{1}{2} IE^2 \cdot R_6 + \tfrac{1}{4} IE^2 \cdot \Delta R_6 \end{aligned}$$

This shows that even when the chip resistance value is doubled, the consumed power of the chip resistance is only $\frac{1}{2}$ the conventional value, thereby allowing the heating to be kept to a minimum during operation. Consequently, the chip resistance can be made smaller in size.

Embodiment 2

Figure 4:
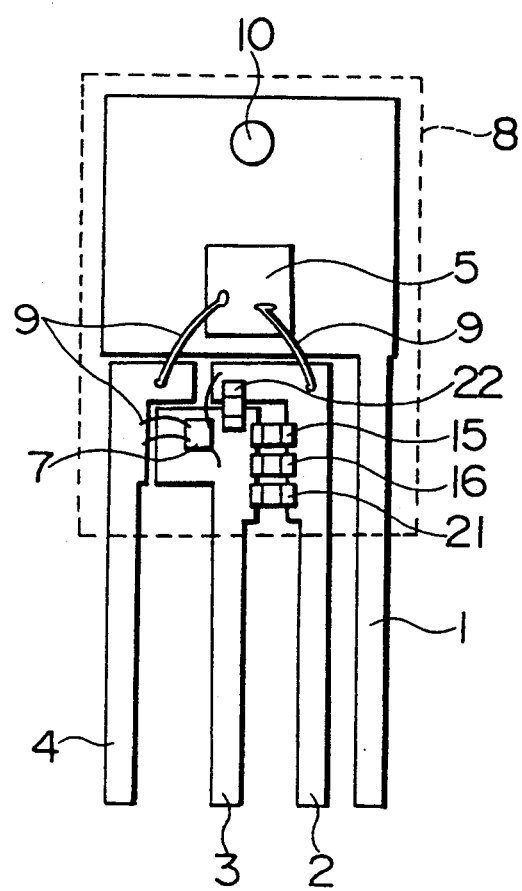
FIG. 4 is a schematic plan view illustrating a resin sealed semiconductor device in accordance with a second embodiment of the invention.

The first embodiment was described using two chip resistances for detecting the current. Instead of using the conventional chip resistance 6, however, it is possible to mount in parallel n chip resistances having values n times that of the resistance value, $R_6$, of the chip resistance 6, thereby reducing changes in resistance values arising from mounting as well as the consumed power of each of the chip resistances to 1/nth the conventional values. FIG. 4 shows an embodiment in which a total of four chip resistances are used by the addition of chip resistances 21 and 22.

Embodiment 3

Figure 5:
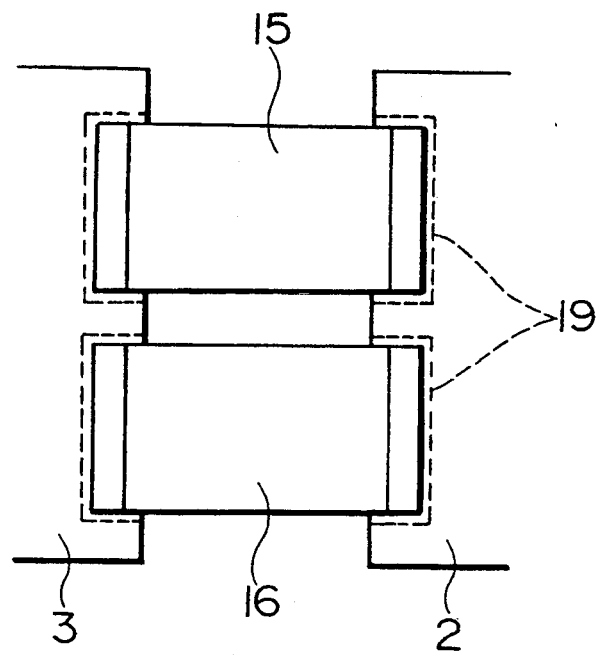
FIG. 5 is a plan view showing chip resistances of a resin sealed semiconductor device in accordance with a third embodiment of the invention.

FIG. 5 is a plan view showing chip resistances of a resin sealed semiconductor device in accordance with a third embodiment of the invention. Referring to the figure, the chip resistances 15 and 16 are mounted by positioning them in grooves 19 in the leads 2 and 3. Fixing the mounting position of the chip resistances 15 and 16 in the grooves 19, which serve as positioning means, reduces changes in resistance values due to variations in mounting.

Embodiment 4

Figure 6:
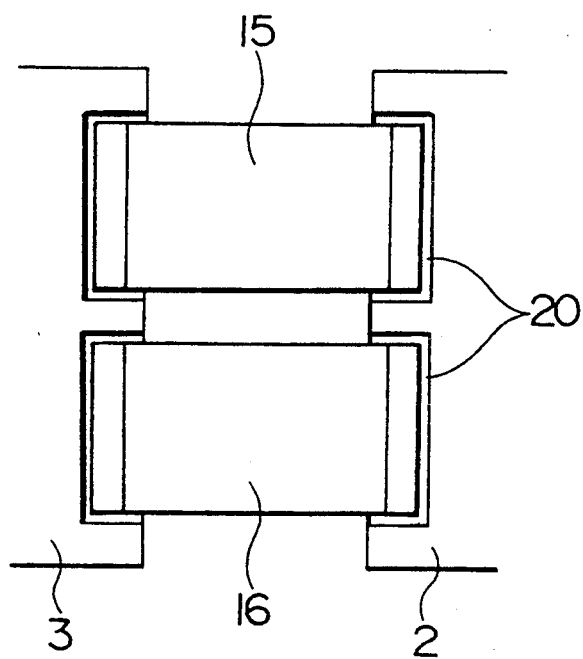
FIG. 6 is a plan view showing chip resistances of a resin sealed semiconductor device in accordance with a fourth embodiment of the invention.
Figure 7:
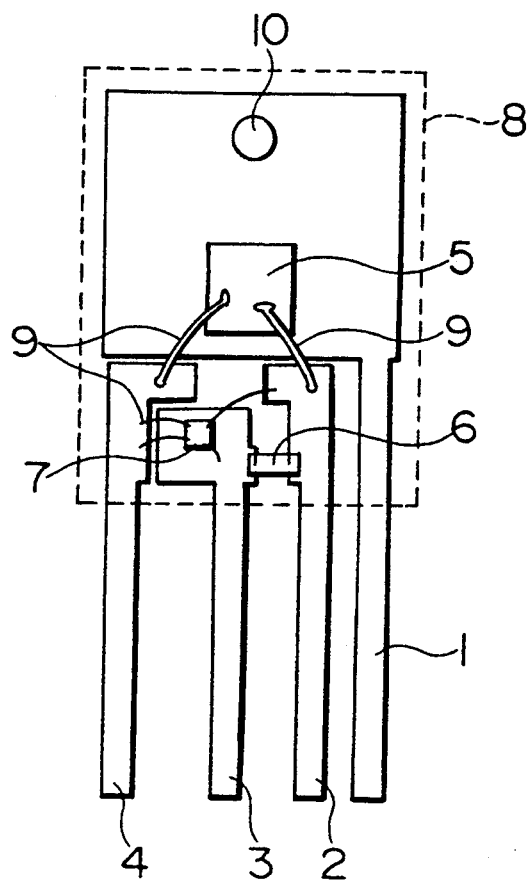
FIG. 7 is a schematic plan view showing a conventional resin sealed semiconductor device.
Figure 8:
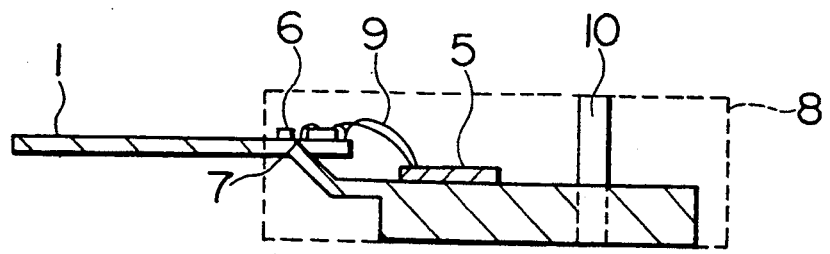
FIG. 8 is a side view showing the resin sealed semiconductor device shown in FIG. 7.
Figure 9:
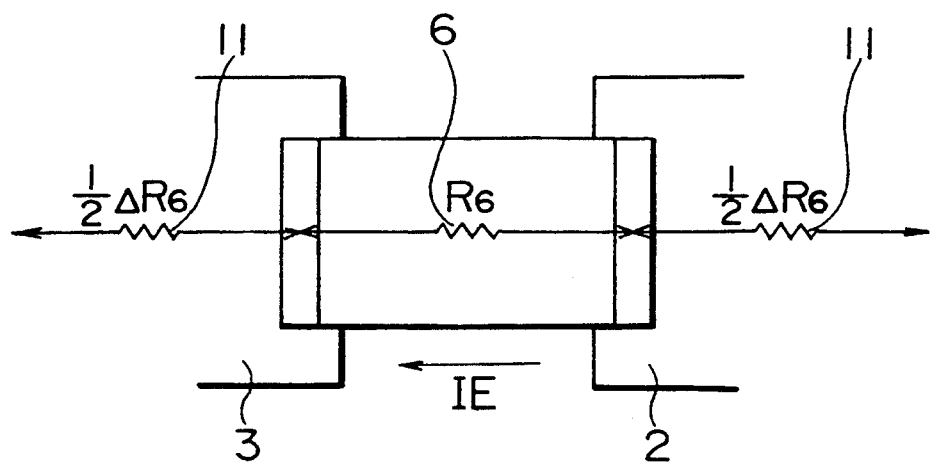
FIG. 9 is an equivalent circuit diagram in the mounting sections of the chip resistances and the like in the resin sealed semiconductor device shown in FIG. 7.
Figure 10:
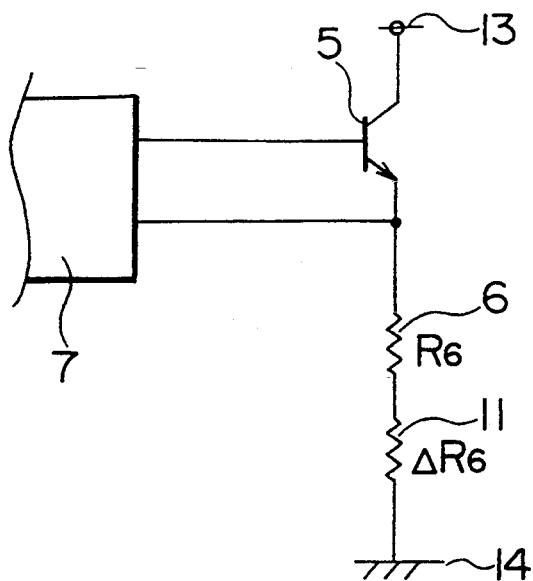
FIG. 10 is an equivalent circuit diagram of the resin sealed semiconductor device shown in FIG. 7.

FIG. 6 is a plan view showing chip resistances of a resin sealed semiconductor device in accordance with a fourth embodiment of the invention. Referring to the figure, the chip resistances 15 and 16 are each mounted in recesses 20 in the leads 2 and 3. Mounting the chip resistances 15 and 16 in the recesses 20 fixes the chip resistances 15 and 16 at fixed positions, minimizing changes in resistance values caused by variations in mounting and also allowing mounting to be carried out with facility.

As described above, a plurality of current-detecting resistances is mounted in parallel, which reduces increases in resistance values when these current-detecting resistances are mounted, so that a high-precision and highly reliable resin sealed semiconductor device can be obtained. In addition, since absolute values of resistance tolerances can be increased, the cost of current-detecting resistances can be reduced. Further, dividing the current detecting resistance reduces the consumed power per current-detecting resistance, making each of the current-detecting resistances smaller in size and thus giving more freedom to the way these resistances can be mounted. The use of positioning means, when mounting, allows mounting to be carried out with facility.

What is claimed is:

1. A resin sealed semiconductor device including a lead frame having a die pad and leads, a semiconductor element mounted on the die pad, a controlling semiconductor element for controlling the semiconductor element, and a current-detecting resistance mounted on leads of the lead frame for detecting current flowing in the semiconductor element and comprising a plurality of current-detecting resistors mounted and electrically connected in parallel.

2. The device according to claim 1 including positioning means on the leads for positioning each of the current-detecting resistors.

3. The device according to claim 1 wherein the positioning means are grooves.

4. The device according to claim 1 wherein the positioning means are recesses.

5. The device according to claim 1 including n current-detecting resistors, each having a resistance n times that of a total resistance of the current-detecting resistance, mounted on the leads and electrically connected in parallel.

* * * * *